(12) United States Patent
Shia et al.

(10) Patent No.: US 12,490,410 B2
(45) Date of Patent: Dec. 2, 2025

(54) CIRCUIT DEVICES INTEGRATED WITH BOILING ENHANCEMENT FOR TWO-PHASE IMMERSION COOLING

(71) Applicant: Intel Corporation, Santa Clara, CA (US)

(72) Inventors: David Shia, Portland, OR (US); Jin Yang, Hillsboro, OR (US); Jimmy Chuang, Taipei (TW); Mohanraj Prabjugoud, Hillsboro, OR (US); Michael T. Crocker, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 741 days.

(21) Appl. No.: 17/542,907

(22) Filed: Dec. 6, 2021

(65) Prior Publication Data
US 2023/0180434 A1  Jun. 8, 2023

(51) Int. Cl.
*H05K 7/20* (2006.01)

(52) U.S. Cl.
CPC ......... *H05K 7/203* (2013.01); *H05K 7/20381* (2013.01)

(58) Field of Classification Search
CPC .. H01L 21/4882; H01L 2023/405; F28F 3/02; F28F 2215/10; F28F 2215/04; F28F 13/12; H05K 7/20154; H05K 7/20409; H05K 1/0203; H05K 7/20436; G06F 1/20
USPC ........................................ 361/700
See application file for complete search history.

(56) References Cited

U.S. PATENT DOCUMENTS

| | | | |
|---|---|---|---|
| 3,163,207 A | * | 12/1964 | Schultz ............... H01L 23/4006 165/68 |
| 4,050,507 A | | 9/1977 | Chu et al. |
| 4,474,231 A | | 10/1984 | Staub et al. |
| 4,479,140 A | | 10/1984 | Horvath |
| 4,483,389 A | | 11/1984 | Balderes et al. |
| 4,606,405 A | | 8/1986 | Nakayama et al. |

(Continued)

FOREIGN PATENT DOCUMENTS

| | | |
|---|---|---|
| CN | 108235666 A | 6/2018 |
| WO | 0223115 A2 | 3/2002 |

OTHER PUBLICATIONS

Mudawar, I., "Optimization of Enhanced Surfaces for High Flux Chip Cooling by Pool Boiling", Journal of Electronic Packaging, vol. 115, Mar. 1993, pp. 89-100.

*Primary Examiner* — Mandeep S Buttar
(74) *Attorney, Agent, or Firm* — Essential Patents Group, LLP

(57) ABSTRACT

A two-phase immersion cooling system for integrated circuit assemblies may be formed utilizing a heat dissipation device thermally coupled to at least one integrated circuit device, wherein the heat dissipation device includes at least one surface and at least one projection extending from the at least one surface, wherein the at least one projection includes at least one sidewall, and wherein the at least one sidewall of the at least one projection includes at least one surface area enhancement structure. Utilizing such a heat dissipation device can boost nucleate boiling, improve boiling performance, reduce superheat required to initiate boiling, boost the critical heat flux during boiling, and can translate to a greater number of integrated circuit devices/packages that can be placed into a single immersion cooling system.

20 Claims, 4 Drawing Sheets

(56) References Cited

U.S. PATENT DOCUMENTS

| | | |
|---|---|---|
| 4,922,376 A | 5/1990 | Pommer et al. |
| 6,118,656 A | 9/2000 | Wang |
| 6,269,864 B1 * | 8/2001 | Kabadi ............... F28F 3/022 |
| | | 174/16.3 |
| 6,504,243 B1 | 1/2003 | Andric et al. |
| 6,853,068 B1 | 2/2005 | Djekic |
| 6,963,130 B1 | 11/2005 | Djekic |
| 7,028,763 B2 | 4/2006 | Garner et al. |
| 7,139,172 B2 | 11/2006 | Bezama et al. |
| 7,203,064 B2 | 4/2007 | Mongia et al. |
| 8,014,150 B2 * | 9/2011 | Campbell ......... H05K 7/20809 |
| | | 165/185 |
| 9,357,675 B2 | 5/2016 | Campbell et al. |
| 9,750,159 B2 | 8/2017 | Campbell et al. |
| 10,297,524 B2 | 5/2019 | Watanabe et al. |
| 10,548,240 B1 | 1/2020 | Iyengar et al. |
| 11,092,391 B2 | 8/2021 | Kandlikar et al. |
| 11,201,102 B2 | 12/2021 | Parida et al. |
| 11,574,853 B2 | 2/2023 | Yu et al. |
| 11,854,936 B2 | 12/2023 | Yu et al. |
| 12,050,061 B2 * | 7/2024 | Kang ................ H01L 23/3733 |
| 12,051,637 B1 | 7/2024 | Gregory et al. |
| 12,238,892 B2 | 2/2025 | Sover et al. |
| 2002/0118511 A1 * | 8/2002 | Dujari ................ H01L 23/427 |
| | | 174/16.3 |
| 2003/0136547 A1 | 7/2003 | Gollan et al. |
| 2003/0168203 A1 * | 9/2003 | Gektin ................ F28F 23/00 |
| | | 257/E23.09 |
| 2004/0262743 A1 * | 12/2004 | Houle ............... H01L 23/3736 |
| | | 257/722 |
| 2005/0034841 A1 | 2/2005 | Barr et al. |
| 2005/0168947 A1 * | 8/2005 | Mok ................. H01L 23/427 |
| | | 361/698 |
| 2005/0280142 A1 * | 12/2005 | Hua .................. H01L 23/3736 |
| | | 257/E23.09 |
| 2006/0138644 A1 * | 6/2006 | Houle ............... H01L 23/3736 |
| | | 257/714 |
| 2008/0302505 A1 | 12/2008 | Kato et al. |
| 2012/0067558 A1 | 3/2012 | Phan et al. |
| 2016/0341492 A1 * | 11/2016 | Watanabe .......... H01L 23/3677 |
| 2017/0176114 A1 | 6/2017 | Kandlikar et al. |
| 2019/0348345 A1 | 11/2019 | Parida et al. |
| 2021/0327787 A1 | 10/2021 | Yang et al. |
| 2022/0201889 A1 | 6/2022 | Sover et al. |
| 2023/0137684 A1 | 5/2023 | Yang et al. |
| 2023/0164953 A1 | 5/2023 | Gregory et al. |
| 2023/0180434 A1 | 6/2023 | Shia et al. |
| 2023/0253288 A1 | 8/2023 | Adebiyi et al. |
| 2024/0063079 A1 | 2/2024 | Shao et al. |

* cited by examiner

CIRCUIT DEVICES INTEGRATED WITH BOILING ENHANCEMENT FOR TWO-PHASE IMMERSION COOLING

TECHNICAL FIELD

Embodiments of the present description generally relate to the field of thermal management for integrated circuit devices, and, more specifically, to two-phase immersion cooling of integrated circuit devices, wherein the cooling is facilitated with heat dissipation devices having projections to enhance the surface area thereof.

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. Thus, heat dissipation devices are used to remove heat from the integrated circuit devices in an integrated circuit package. In one example, an integrated heat spreader, made from copper or other high thermal conductivity material, may be integrated with the integrated circuit devices for heat removal. The integrated heat spreader, in turn, dissipate the heat into the surrounding atmosphere. In another example, a cooling device, such as a heat exchanger or a heat pipe, may be thermally attached to integrated circuit devices for heat removal. In still another example, integrated circuit devices and/or packages may be immersed in a liquid, wherein heat is dissipated into the liquid without the liquid changing phases (e.g., single phase cooling). However, as power densities and power envelopes increase to reach peak performance, these methods are becoming ineffective in removing sufficient heat.

One emerging heat removal technique is two-phase immersion cooling. This technique essentially comprises immersing an integrated circuit assembly into a liquid cooling bath containing a low boiling point liquid which vaporizes and, thus, cooling the integrated circuit assembly through latent heat transfer, as it generates heat. Although it is a promising technology, two-phase immersion cooling has various challenges to achieve effective operation, as will be understood to those skilled in the art.

For example, in one embodiment of a two-phase immersion cooling assembly, a support substrate, such as a copper block, having a first surface and an opposing second surface, may have a boiling enhancement coating on the first surface and may have the second surface in thermal contact with the heat dissipation device by a thermal interface material layer, such as an indium/aluminum foil. However, the thermal interface material layer may contribute to the thermal resistance of the assembly, which may result in the assembly being incapable of removing a sufficient amount of heat.

In another example of an embodiment of a two-phase immersion cooling assembly, a boiling enhancement structure, such as a multi-layer copper meshing, may be attached to the heat dissipation device or to the integrated circuit devices directly with a low melting temperature solder, such as a 58% bismuth/42% tin eutectic solder. This configuration eliminates the thermal resistance of the thermal interface material layer of the previous example.

An additional limitation of two-phase immersion cooling is cost-effectiveness. The cost-effectiveness of a two-phase immersion cooling system may be increased by increasing the density of the overall system. In other words, by increasing the number of integrated circuit devices/packages/sockets, there is a significant change in the cost structure of implementing a two-phase immersion system.

Thus, there is an on-going effort to improve the operation, efficiency, and cost-effectiveness of two-phase immersion cooling assemblies.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
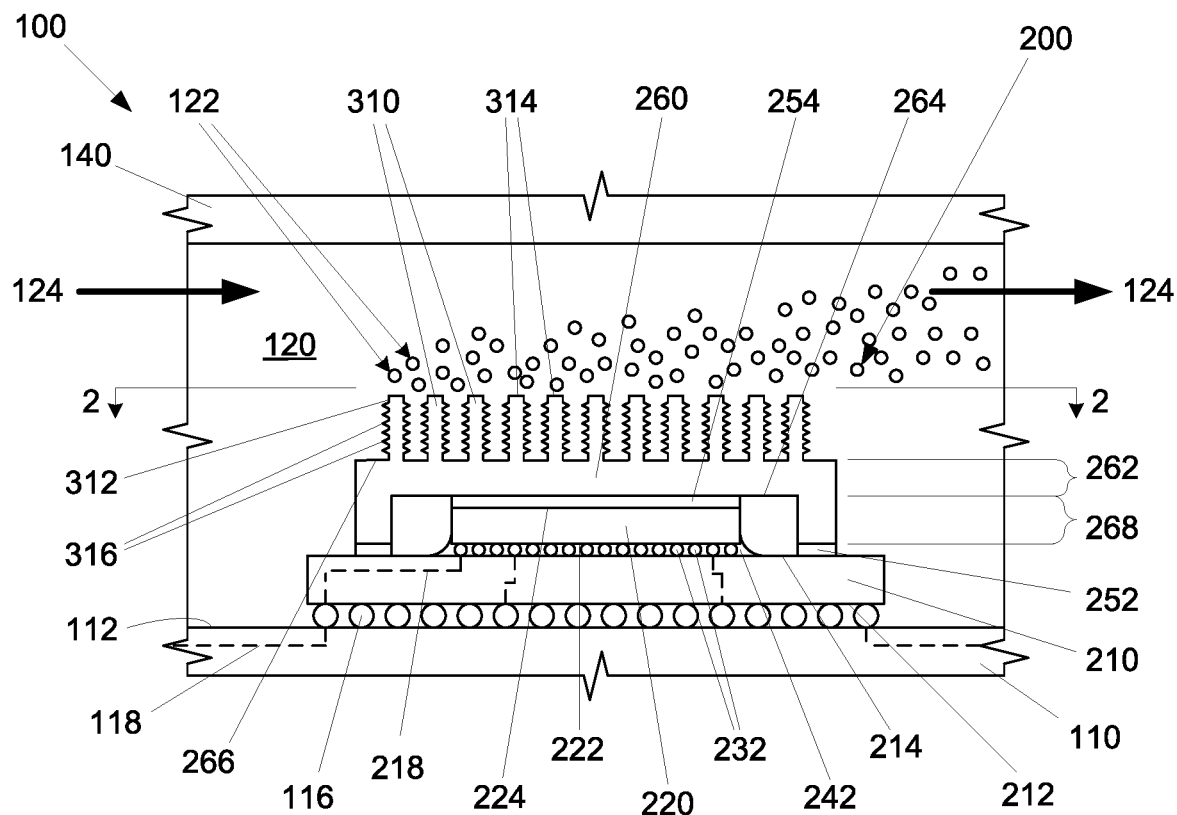
FIG. 1 is a side cross-sectional view of an integrated circuit assembly, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the use of two-phase immersion cooling for integrated circuit assemblies. In one embodiment of the present description, the integrated circuit assembly may comprise an integrated circuit package having a heat dissipation device thermally coupled to at least one integrated circuit device, wherein the heat dissipation device includes at least one surface and at least one projection extending from the at least one surface, wherein the at least one projection includes at least one sidewall, and wherein the at least one sidewall of the at least one projection includes at least one surface area enhancement structure.

FIG. 1 illustrates an integrated circuit assembly 100 having at least one integrated circuit package 200 electrically attached to an electronic substrate 110. The electronic substrate 110 may be any appropriate structure, including, but not limited to, a motherboard, printed circuit board, and the like. The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 110 may further include conductive routes 118 or "metallization" (shown in dashed lines) extending through the electronic substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate.

The at least one integrated circuit package 200 may be electrically attached to the electronic substrate 110 in a configuration generally known as a flip-chip or controlled collapse chip connection ("C4") configuration, according to an embodiment of the present description. The integrated circuit package 200 may comprise a package substrate or interposer 210 with a first surface 212 and an opposing second surface 214, and an integrated circuit device 220 electrically attached proximate the second surface 214 of the package interposer 210. In an embodiment of the present description, the package interposer 210 may be attached to the electronic substrate or board 110 with a plurality of package-to-substrate interconnects 116. In one embodiment of the present description, the package-to-substrate interconnects 116 may extend between bond pads (not shown) proximate a first surface 112 of the electronic substrate 110 and bond pads (not shown) proximate the first surface 212 of the package interposer 210. Although not specifically illustrated, it is understood that any appropriate number of integrated circuit devices may be mounted on the package interposer 210.

The package interposer 210 may comprise any of the materials and/or structures as discussed previously with regard to the electronic substrate 110. The package interposer 210 may further include conductive routes 218 or "metallization" (shown in dashed lines) extending through the package interposer 210, which may comprise any of the materials and/or structures as discussed previously with regard to the conductive routes 118 of the electronic substrate 110. Bond pads (not shown) proximate the first surface 212 of the package interposer 210 may be in electrical contact with the conductive routes 218, and the conductive routes 218 may extend through the package interposer 210 and be electrically connected to bond pads (not shown) proximate the second surface 214 of the package substrate 210. As will be understood to those skilled in the art, the package interposer 210 may be a cored substrate or a coreless substrate.

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, and the like. As shown in FIG. 1, the integrated circuit device 220 may have a first surface 222 and an opposing second surface 224. It is understood that, although only a single integrated circuit device 220 is illustrated, any appropriate number of integrated circuit devices may be electrically attached to the package interposer 210.

In an embodiment of the present description, the integrated circuit device 220 may be electrically attached to the package interposer 210 with a plurality of device-to-substrate interconnects 232. In one embodiment of the present description, the device-to-substrate interconnects 232 may extend between bond pads (not shown) on the second surface 214 of the package interposer 210 and bond pads (not shown) on the first surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment of the present description, the device-to-substrate interconnects 232 may be solder balls formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). In another embodiment of the present description, the device-to-substrate interconnects 232 may be copper bumps or pillars. In a further embodiment of the present description, the device-to-substrate interconnects 232 may be metal bumps or pillars coated with a solder material.

The device-to-substrate interconnects 232 may be in electrical communication with integrated circuitry (not shown) within the integrated circuit device 220 and may be in electrical contact with the conductive routes 218. The conductive routes 218 may extend through the package interposer 210 and be electrically connected to package-toboard interconnects 116. As will be understood to those skilled in the art, the package interposer 210 may reroute a fine pitch (center-to-center distance) of the device-to-interposer interconnects 232 to a relatively wider pitch of the package-to-substrate interconnects 116. The package-to-substrate interconnects 116 may be any appropriate electrically conductive material, including, but not limited to, metal filled epoxies and solders, such as tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). Although FIG. 1 shows the integrated circuit package 200 attached to the electronic substrate 110 with an interconnect-type attachment, the embodiments of the present description are not so limited. For example, the integrated circuit package 200 may be attached to a socket (not shown) that is electrically attached to the first surface 112 of the electronic substrate 110.

As further shown in FIG. 1, the integrated circuit package 200 may further include a heat dissipation device 260. The heat dissipation device 260 may include, but is not limited to, an integrated heat spreader (shown), a heat dissipation plate, or any such thermally conductive device, that may be thermally coupled with the second surface 224 of the integrated circuit device 220 with an internal thermal interface material 254. The heat dissipation device 260 may comprise a main body 262, having a first surface 264, an opposing second surface 266, at least one sidewall 268, and at least one boundary wall 272 extending from the first surface 264 of the main body 262 of the heat dissipation device 260. The at least one boundary wall 272 may be attached or sealed to the first surface 212 of the package interposer 210 with an attachment adhesive or sealant layer 252.

The heat dissipation device 260 may be made of any appropriate thermally conductive material, including, but not limited to, at least one metal material and alloys of more than one metal, or highly doped glass or highly conductive ceramic material, such as aluminum nitride. In an embodiment of the present description, the heat dissipation device 260 may comprise copper, nickel, aluminum, alloys thereof, laminated metals including coated materials (such as nickel coated copper), and the like. The internal thermal interface material 254 may be any appropriate, thermally conductive material, including, but not limited to, a thermal grease, a thermal gap pad, a polymer, an epoxy filled with high thermal conductivity fillers (such as metal particles or silicon particles), a metal alloy (such as solder or liquid metal), and the like.

As illustrated in FIG. 1, the heat dissipation device 260 may be a single material throughout, such as when the heat dissipation device 260, including the heat dissipation device boundary wall 272, is formed by a single process step, including but not limited to, stamping, skiving, molding, 3-D printing, and the like. However, embodiments of the present description may also include the heat dissipation device 260 being made of more than one component. For example, the heat dissipation device boundary wall 272 may be formed separately from the main body 262, then attached together to form the heat dissipation device 260. In one embodiment of the present description, the boundary wall 272 may be a single "picture frame" structure surrounding the integrated circuit device 220.

The attachment adhesive 252 may be any appropriate material, including, but not limited to, silicones (such as polydimethylsiloxane), epoxies, and the like. It is understood that the boundary wall 272 not only secures the heat dissipation device 260 to the package interposer 210, but also helps to maintain a desired distance (e.g., bond line thickness) between the first surface 264 of the heat dissipation device 260 and the second surface 224 of the integrated circuit device 220.

Prior to the attachment of the heat dissipation device 260, an electrically-insulating underfill material 242 may be disposed between the integrated circuit device 220 and the package interposer 210, which substantially encapsulates the device-to-interposer interconnects 232. The underfill material 242 may be used to reduce mechanical stress issues that can arise from thermal expansion mismatch between the package interposer 210 and the integrated circuit device 220. The underfill material 242 may be an appropriate material, including, but not limited to epoxy, cyanoester, silicone, siloxane and phenolic based resins, that has sufficiently low viscosity to be wicked between the integrated circuit device 220 and the package interposer 210 by capillary action when introduced by an underfill material dispenser (not shown), which will be understood to those skilled in the art. The underfill material 242 may be subsequently cured (hardened), such as by heat or radiation.

As shown in FIG. 1, the integrated circuit assembly 100 may further include a dielectric low-boiling point liquid 120 in contact with the integrated circuit package 200. As illustrated, the dielectric low-boiling point liquid 120 may vaporize (shown in vapor or gas state as bubbles 122) proximate the heat dissipation device 260. For the purpose of the present application, the dielectric low-boiling point liquid 120 may be defined to be a liquid having a boiling point lower than about 60 degrees Celsius. In one embodiment of the present description, the dielectric low-boiling point liquid 120 may comprise a fluorocarbon-based fluid. In an embodiment of the present description, the dielectric low-boiling point liquid 120 may comprise fluorochamicals, including, but not limited to, perfluorohexane, perfluorocarbon, fluoroketone, hydrofluoroether (HFE), hydrofluorocarbon (HFC), hydrofluoroolefin (HFO), and the like. In another embodiment of the present description, the dielectric low-boiling point liquid 120 may comprise a perfluoroalkylmorpholine, such as 2,2,3,3,5,5,6,6-octafluoro-4-(trifluoromethyl)morpholine. As further shown in FIG. 1, the dielectric low-boiling point liquid 120 may flow (shown by arrows 124) between the electronic substrate 110 and an adjacent electronic substrate or fluid containment structure 140.

As will be understood to those skilled in the art, two-phase immersion cooling is driven by pool boiling operating in a nucleate boiling region. The operation of a particular system is defined by a pool boiling curve, which will be different for differing systems. However, regardless of the particular system, its pool boiling curve will travel through three distinct boiling regions. The first region is the nucleate boiling region, wherein discrete bubbles nucleate, form, and separate from a heated surface (i.e., the heat dissipation device 260). The end point of nucleate boiling is called the critical heat flux. The second region is the transition boiling region, wherein discrete bubbles start to coalesce and form columns when separating from the heated surface (it is an unstable region). The third region is the film boiling region, which is marked by a rapid rise of surface temperature of the heat surface, wherein a thin and insulating layer of vapor is formed over the heated surface. This region should be avoided to prevent damage to the heat dissipation device 260, as will be understood to those skilled in the art. Thus, the two-phase immersion cooling should be operated within the first region, i.e., the nucleate boiling region.

As will be understood to those skilled in the art, there are three approaches that can be taken to enhance cooling performance in the nucleate boiling region. First, the boiling temperature starting point can be lowered by shifting/lower the incipient point of boiling. Second, the slope of the pool boiling curve can be altered in the nucleate boiling region. Third, the critical heat flux value can be raised. The embodiments of the present description take the first and third approaches by creating at least one projection 310 extending from the second surface 266 of the main body 262 of the heat dissipation device 260. The at least one projection 310 may be defined by at least one sidewall 312 extending from the second surface 266 of the main body 262 of the heat dissipation device 260 and terminating in a top surface 314. As shown in FIG. 1, the at least one projection 310 may have at least one surface area enhancement structure 316 extending from the at least one sidewall 312 of the at least one projection 310. In one embodiment, as shown, the at least one surface area enhancement structure 316 may comprise a plurality of stud structures having a triangular cross-section (e.g., cones, pyramids, truncated versions thereof, or the like).

Figure 2:
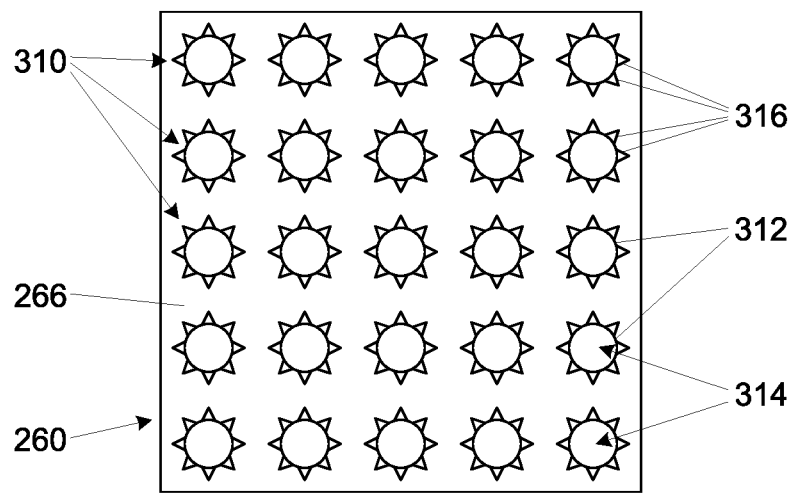
FIG. 2 is a top view of a heat dissipation device along line 2-2 of FIG. 1, according to an embodiment of the present description.

As shown in FIG. 2, the projections 310 may be substantially cylindrical and may be distributed in any appropriate manner. For example, as shown in FIG. 2, the projections 310 may be in ordered rows and columns. However, the embodiments of the present description are not so limited. As will be understood, the projections 310 may be staggered or they may be clustered, such as having a high concentration over a hotspot (not shown) in the integrated circuit device 220 (see FIG. 1).

Figure 3:
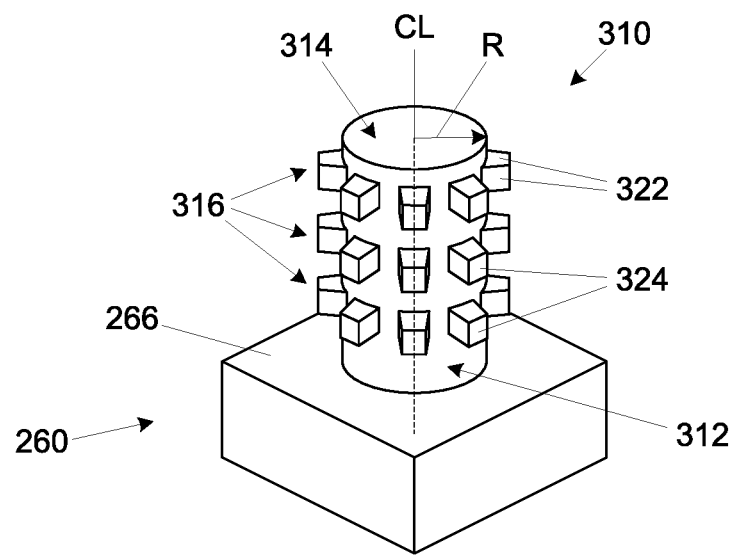
FIG. 3 is an oblique view of a heat dissipation device having a projection thereon, wherein the projection includes at least one stud-type surface enhancement structure extending therefrom, according to an embodiment of the present description.

In one embodiment, shown in FIG. 3, the at least one projection 310 may be substantially cylindrical and defined by the at least one sidewall 312 extending substantially perpendicularly from the second surface 266 of the main body 262 of the heat dissipation device 260, extending radially (e.g., radius R) about a centerline CL, and terminating in the top surface 314. As shown in FIG. 3, the at least one surface area enhancement structure 316 may comprise a plurality of stud structures, extending radially from the at least one sidewall 312 of the at least one projection 310. In one embodiment, as shown, each of the stud structures 316 may be defined by at least one stud wall 322 and terminating in an outer stud surface 324.

Figure 4:
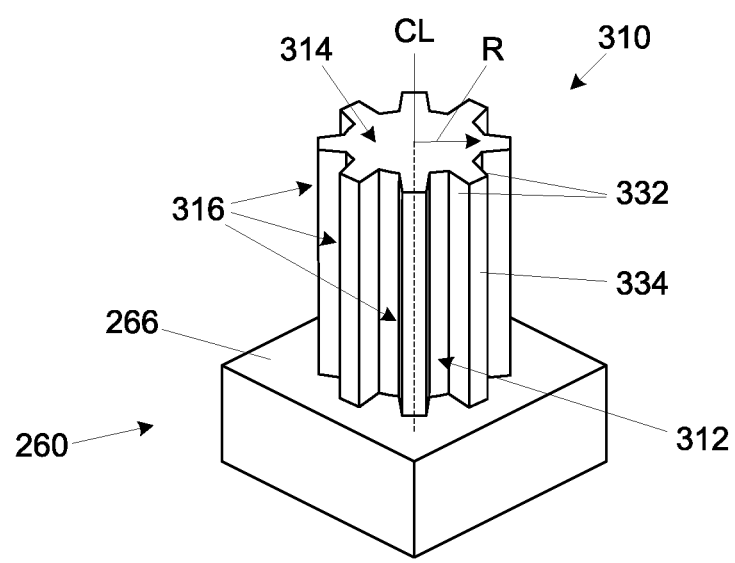
FIG. 4 is an oblique view of a heat dissipation device having a projection thereon, wherein the projection includes at least one fin-type surface enhancement structure extending therefrom, according to another embodiment of the present description.

In another embodiment, shown in FIG. 4, the at least one projection 310 may be similar to what has been described with regard to FIG. 3. As shown in FIG. 4, the at least one surface area enhancement structure 316 may comprise a plurality of fin structures, extending radially from the at least one sidewall 312 of the at least one projection 310. In one embodiment, as shown, each fin structure 316 may be defined by a pair of opposing fin walls 322 and terminating in an outer fin surface 334. In an embodiment, as shown, at least one of the fin structures 316 may extend from the second surface 266 of the main body 262 of the heat dissipation device 260 to the top surface 314 of the projection 310. Although studs are shown in FIG. 3 and fins are shown in FIG. 4 for the surface area enhancement structures 316, the embodiment of the present description are not so limited and may be any appropriate shape and configuration.

The projections 310 (including the at least one surface area enhancement structure 316) may be formed by any known technique in the art. In one embodiment, the projections 310, including the at least one surface area enhancement structure 316, may be made simultaneously with the entire heat dissipation device 260, such as with molding process (e.g., metal injection molding), a 3D printing process, and the like. In another embodiment, the projections 310 may be formed from the heat dissipation device 260 itself, such as by ablation, etching, skiving, and the like. In a further embodiment of the present description, the projections 310 may be formed on the second surface 266 of the main body 262 of the heat dissipation device (either the same or different material), such as with a build-up process (e.g. 3D printing process). In still a further embodiment of the present description, the at least one surface area enhancement structures 316 may be formed on or in the projections 310 after the formation thereof by an ablation technique, such as with a sandblasting process.

Figure 5:
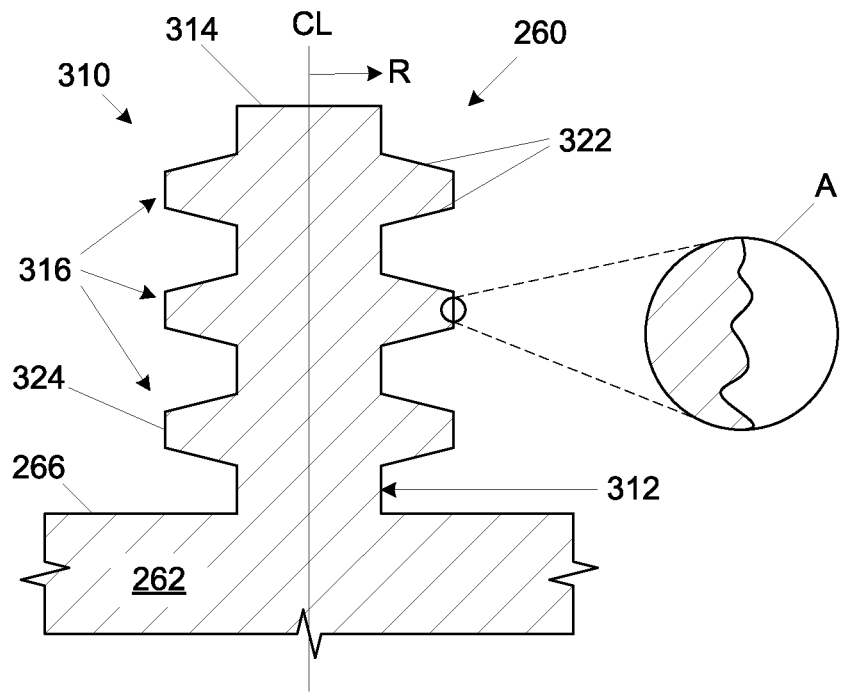
FIG. 5 is a side cross-sectional view of a heat dissipation device having a projection with a roughen surface, according to an embodiment of the present description.

FIG. 5 illustrates a cross-sectional view of the embodiment illustrated in FIG. 3. In one embodiment, the at least one projection 310 may be a single material with the main body 262 of the heat dissipation device 260, such as when a molding or a 3D printing process is used in the formation thereof. As further illustrated in FIG. 5, any of the surfaces of the heat dissipation device 260 (e.g., the stud walls 322, the stud outer surface 324 (illustrated with exploded view A), the projection sidewall 312, the projection top surface 314, and/or the main body second surface 266) may be roughened or made porous to form bubble nucleation sites in order to lower the incipient point to improve performance.

The size of the bubble nucleation sites on the heat dissipation device 260 may be determined by Hsu's criterion, which is well known in the art and will not be discussed herein. The creation of the bubble nucleation sites may be achieved by any known process in the art. In one embodiment of the present description, sandblasting may be used to roughen or otherwise create the features/sites needed for bubble nucleation. It is understood that the parameters in the sandblasting process may be optimized to achieve a desired roughness or feature size. These parameters may include sand size, sandblast pressure, and sandblast angle.

Figure 6:
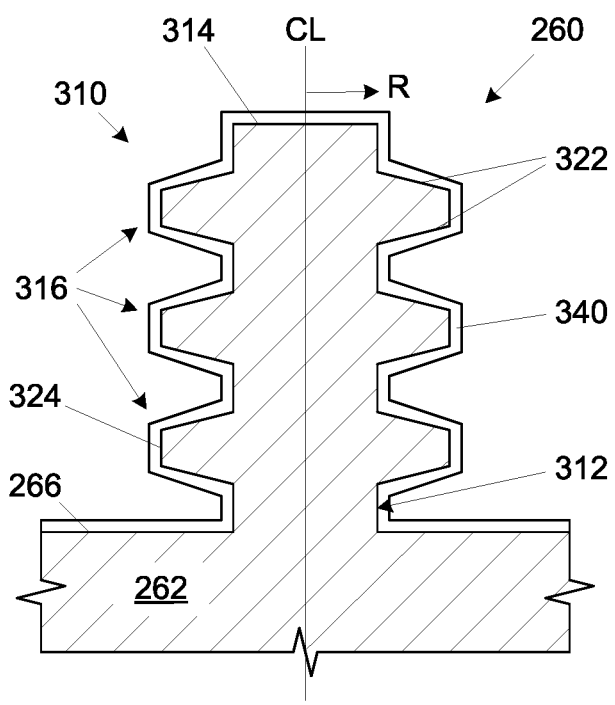
FIG. 6 is a side cross-sectional view of a coated heat dissipation device having a projection, according to one embodiment of the present description.

FIG. 6 illustrates a cross-sectional view of the embodiment illustrated in FIG. 3. In one embodiment, a coating layer 340 may be formed on the heat dissipation device 260. In an embodiment of the present description, the coating layer 340 may contact all surfaces and walls of the projection 310 (illustrated as the stud walls 322, the stud outer surface 324, the projection sidewall 312, and the projection top surface 314), as well as the second surface 266 of the main body 262 of the heat dissipation device 260. In one embodiment of the present description, the coating layer 340 may be a barrier layer. For example, material(s) used in the formation of the heat dissipation device 260 may not be compatible with the dielectric low-boiling point liquid 120 (see FIG. 1), such as copper, and a thermally conductive coating layer 340, such as nickel, may be formed. In another embodiment of the present description, the coating layer 340 may be a boiling enhancement layer, such as a micro-porous coating or a coating of dispersed metal powder/particles manufactured by a sintering process or a build-up process, including, but not limited to, cold spray, plating process, and the like. As will be understood to those skilled in the art, the micro-porous coating and the dispersed metal powder/particle coating may provide capillarity for fluid travel of the dielectric low-boiling point liquid 120 (see FIG. 1) and provide enhanced nucleation sites. The use of a coating layer 340 as a boiling enhancement layer may obviate the need to roughen/sandblast the projections 310 to form nucleation sites, as discussed with regard to FIG. 5.

As will be understood, by removing known structures, like the boiler plates (as previously discussed), and replacing them with any embodiment of the present description, the height requirement (z-height) can be significantly reduced, which may result in a greater number of integrated circuit devices/packages that can be placed into a single immersion cooling system. Likewise, the protrusions with surface area enhancement structure of the embodiments of the present description can boost nucleate boiling, improve boiling performance, and reduce superheat required to initiate boiling. Moreover, the increased surface area of the embodiment of the present description can boost the critical heat flux during boiling, which can translate to a greater number of integrated circuit devices/packages that can be placed into a single immersion cooling system.

Figure 7:
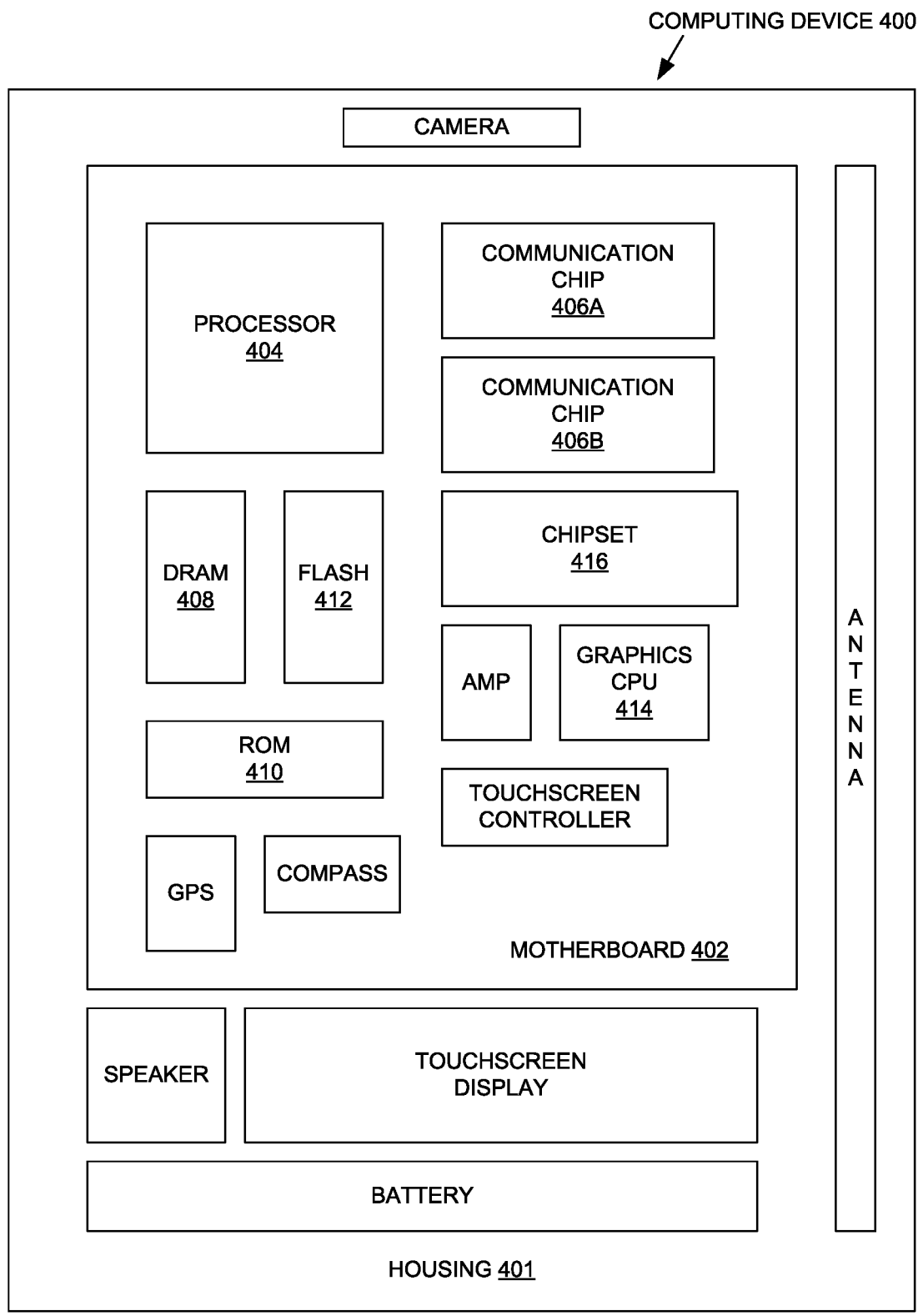
FIG. 7 is an electronic system, according to one embodiment of the present description.

FIG. 7 illustrates an electronic or computing device/system 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

The entire computing device 400 or at least one of the integrated circuit components within the computing device 400 may be immersed in a two-phase immersion system. In one embodiment, the integrated circuit component may comprise an integrated circuit package including a heat dissipation device having at least one surface and at least one projection extending from the at least one surface of the heat dissipation device, wherein the at least one projection includes at least one sidewall, and wherein the at least one sidewall of the at least one projection includes at least one surface area enhancement structure.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-7. The subject matter may be applied to various heat dissipation assemblies, other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus, comprising a heat dissipation device having at least one surface and at least one projection extending from the at least one surface of the heat dissipation device, wherein the at least one projection includes at least one sidewall, and wherein the at least one sidewall of the at least one projection includes at least one surface area enhancement structure.

In Example 2, the subject matter of Example 1 can optionally include the at least one surface area enhancement structure comprising a plurality of stud structures.

In Example 3, the subject matter of Example 2 can optionally include the at least one of the stud structures being defined by least one stud wall and terminating in an outer stud surface.

In Example 4, the subject matter of Example 1 can optionally include the at least one surface area enhancement structure comprising a plurality of fin structures.

In Example 5, the subject matter of Example 4 can optionally include at least one of the fin structures of the plurality of fin structures being defined by a pair of opposing fin walls and terminating in an outer fin surface.

In Example 6, the subject matter of any of Examples 1 to 5 can optionally include the at least one projection being substantially cylindrical.

In Example 7, the subject matter of Example 6 can optionally include the at least one cylindrical projection being defined by at least one sidewall extending substantially perpendicularly from the second surface of the main body of the heat dissipation device, extending radially about a centerline thereof, and terminating in a top surface.

In Example 8, the subject matter of Example 7 can optionally include the at least one surface area enhancement structure comprising a plurality of stud structures extending radially from the at least one sidewall of the at least one cylindrical projection.

In Example 9, the subject matter of Example 7 can optionally include the at least one surface area enhancement structure comprising a plurality of fin structures extending radially from the at least one sidewall of the at least one cylindrical projection.

Example 10 is an apparatus, comprising an integrated circuit device having a first surface and an opposing second surface, a heat dissipation device having a first surface and an opposing second surface, wherein the first surface of the first surface of the heat dissipation device is thermally attached to the second surface of the integrated circuit device, wherein the heat dissipation device includes at least one projection extending from the second surface of the heat dissipation device, wherein the at least one projection includes at least one sidewall, and wherein the at least one sidewall of the at least one projection includes at least one surface area enhancement structure.

In Example 11, the subject matter of Example 10 can optionally include the at least one surface area enhancement structure comprising a plurality of stud structures.

In Example 12, the subject matter of Example 11 can optionally include the at least one of the stud structures being defined by least one stud wall and terminating in an outer stud surface.

In Example 13, the subject matter of Example 10 can optionally include the at least one surface area enhancement structure comprising a plurality of fin structures.

In Example 14, the subject matter of Example 13 can optionally include at least one of the fin structures of the plurality of fin structures being defined by a pair of opposing fin walls and terminating in an outer fin surface.

In Example 15, the subject matter of any of Examples 10 to 14 can optionally include the at least one projection being substantially cylindrical.

In Example 16, the subject matter of Example 15 can optionally include the at least one cylindrical projection being defined by at least one sidewall extending substantially perpendicularly from the second surface of the main body of the heat dissipation device, extending radially about a centerline thereof, and terminating in a top surface.

In Example 17, the subject matter of Example 16 can optionally include the at least one surface area enhancement structure comprising a plurality of stud structures extending radially from the at least one sidewall of the at least one cylindrical projection.

In Example 18, the subject matter of Example 16 can optionally include the at least one surface area enhancement structure comprising a plurality of fin structures extending radially from the at least one sidewall of the at least one cylindrical projection.

Example 19 is a system, comprising an electronic board and an integrated circuit package electrically attached to the electronic board, wherein the integrated circuit package comprises an integrated circuit device having a first surface and an opposing second surface, a heat dissipation device having a first surface and an opposing second surface, wherein the first surface of the first surface of the heat dissipation device is thermally attached to the second surface of the integrated circuit device, wherein the heat dissipation device includes at least one projection extending from the second surface of the heat dissipation device, wherein the at least one projection includes at least one sidewall, and wherein the at least one sidewall of the at least one projection includes at least one surface area enhancement structure.

In Example 20, the subject matter of Example 19 can optionally include the at least one surface area enhancement structure comprising a plurality of stud structures.

In Example 21, the subject matter of Example 20 can optionally include the at least one of the stud structures being defined by least one stud wall and terminating in an outer stud surface.

In Example 22, the subject matter of Example 19 can optionally include the at least one surface area enhancement structure comprising a plurality of fin structures.

In Example 23, the subject matter of Example 22 can optionally include at least one of the fin structures of the plurality of fin structures being defined by a pair of opposing fin walls and terminating in an outer fin surface.

In Example 24, the subject matter of any of Examples 19 to 23 can optionally include the at least one projection being substantially cylindrical.

In Example 25, the subject matter of Example 24 can optionally include the at least one cylindrical projection being defined by at least one sidewall extending substantially perpendicularly from the second surface of the main body of the heat dissipation device, extending radially about a centerline thereof, and terminating in a top surface.

In Example 26, the subject matter of Example 25 can optionally include the at least one surface area enhancement structure comprising a plurality of stud structures extending radially from the at least one sidewall of the at least one cylindrical projection.

In Example 27, the subject matter of Example 25 can optionally include the at least one surface area enhancement structure comprising a plurality of fin structures extending radially from the at least one sidewall of the at least one cylindrical projection.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
    an integrated circuit device comprising a first surface to couple with a plurality of interconnects, and a second surface opposite the first surface;
    an integrated heat spreader of a single material, the integrated heat spreader comprising:
        a main body over the second surface of the integrated circuit device and extending beyond an edge of the integrated circuit device, the main body having a first surface facing the second surface of the integrated circuit device; and
        a sidewall adjacent the edge of the integrated circuit device; and
    a plurality of substantially cylindrical projections, opposite the first surface of the integrated heat spreader, wherein each of the projections includes at least one sidewall, which further includes a plurality of surface area enhancement structures that are to nucleate vapor bubbles within a dielectric liquid.

2. The apparatus of claim 1, wherein the surface area enhancement structures comprise a plurality of stud structures extending radially from the sidewall of the projections.

3. The apparatus of claim 2, wherein each of the stud structures is defined by least one stud wall and terminating in an outer stud surface.

4. The apparatus of claim 1, wherein the surface area enhancement structures comprise a plurality of fin structures extending radially from the sidewall of the projections.

5. The apparatus of claim 4, wherein each of the fin structures is defined by a pair of opposing fin walls terminating in an outer fin surface.

6. The apparatus of claim 1, further comprising:
    dielectric liquid in direct contact with the second surface of the integrated heat spreader and in direct contact with each of the projections; and a thermal interface material in direct contact with the second surface of the integrated circuit device and in direct contact with the first surface of the integrated heat spreader.

7. The apparatus of claim 1, wherein each of the projections is defined by at least one sidewall extending substantially perpendicularly from the second surface of the main body of the integrated heat spreader, extending radially about a centerline thereof, and terminating in a top surface.

8. The apparatus of claim 7, wherein the surface area enhancement structures comprise a plurality of stud structures extending radially from the at least one sidewall of each of the cylindrical projections.

9. The apparatus of claim 7, wherein the surface area enhancement structures comprise a plurality of fin structures extending radially from the at least one sidewall of each of the cylindrical projections.

10. An apparatus, comprising:
a dielectric liquid;
a package substrate submerged within the dielectric liquid, the package substrate having a first surface to couple to a host, and an opposing second surface;
an integrated circuit device having a first surface coupled to the second surface of the package substrate through a plurality of interconnects, and an opposing second surface; and
an integrated heat spreader attached to the second surface of the package substrate through an adhesive or sealant layer, wherein the integrated heat spreader comprises:
a main body over the second surface of the integrated circuit device and extending beyond an edge of the integrated circuit device, the main body having a first surface facing the second surface of the integrated circuit device;
a sidewall adjacent the edge of the integrated circuit device; and
a plurality of substantially cylindrical projections, wherein each of the projections includes at least one sidewall, which further includes a plurality of surface area enhancement structures that are to nucleate vapor bubbles within the dielectric liquid.

11. The apparatus of claim 10, wherein the surface area enhancement structures comprise a plurality of stud structures extending radially from the sidewall of the projections.

12. The apparatus of claim 10, comprise a plurality of fin structures extending radially from the sidewall of the projections.

13. The apparatus of claim 10, wherein further comprising a thermal interface material in direct contact with the second surface of the integrated circuit device and in direct contact with the first surface of the integrated heat spreader.

14. The apparatus of claim 10, wherein each of the projections is defined by at least one sidewall extending substantially perpendicularly from the second surface of the main body of the integrated heat spreader, extending radially about a centerline thereof, and terminating in a top surface.

15. The apparatus of claim 14, wherein the surface area enhancement structures comprise a plurality of stud structures extending radially from the at least one sidewall of each of the cylindrical projections.

16. The apparatus of claim 14, wherein the surface area enhancement structures comprise a plurality of fin structures extending radially from the at least one sidewall of each of the cylindrical projections.

17. A system, comprising:
a dielectric liquid;
an electronic board with a first surface exposed to the dielectric liquid; and
an integrated circuit package submerged in the dielectric liquid and electrically attached to the first surface of the electronic board through a plurality of first interconnects, wherein the integrated circuit package comprises:
a package substrate having a first surface coupled to the first interconnects, and an opposing second surface;
an integrated circuit device having a first surface coupled to the second surface of the package substrate through a plurality of second interconnects, and an opposing second surface;
an integrated heat spreader attached to the second surface of the package substrate through an adhesive or sealant layer, wherein the integrated heat spreader comprises:
a main body over the second surface of the integrated circuit device and extending beyond an edge of the integrated circuit device, the main body having a first surface facing the second surface of the integrated circuit device;
a sidewall adjacent the edge of the integrated circuit device; and
a plurality of substantially cylindrical projections, wherein each of the projections includes at least one sidewall, which further includes a plurality of surface area enhancement structures that are to nucleate vapor bubbles within the dielectric liquid.

18. The system of claim 17, wherein the surface area enhancement structures comprise a plurality of stud structures extending radially from the sidewall of the projections.

19. The system of claim 17, wherein the surface area enhancement structures comprise a plurality of fin structures extending radially from the sidewall of the projections.

20. The system of claim 17, wherein the integrated circuit package further comprises a thermal interface material in direct contact with the second surface of the integrated circuit device and in direct contact with the first surface of the integrated heat spreader.

* * * * *